US011862667B2

(12) United States Patent
Obata et al.

(10) Patent No.: US 11,862,667 B2
(45) Date of Patent: Jan. 2, 2024

(54) CAPACITOR

(71) Applicant: KABUSHIKI KAISHA TOSHIBA, Minato-ku (JP)

(72) Inventors: Susumu Obata, Yokohama (JP); Keiichiro Matsuo, Yokohama (JP); Mitsuo Sano, Yokohama (JP); Kazuhito Higuchi, Yokohama (JP); Kazuo Shimokawa, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 16/747,675

(22) Filed: Jan. 21, 2020

(65) Prior Publication Data
US 2020/0235200 A1 Jul. 23, 2020

(30) Foreign Application Priority Data

Jan. 21, 2019 (JP) .............................. JP2019-007776

(51) Int. Cl.
H01L 49/02 (2006.01)
H01L 29/94 (2006.01)
H10B 12/00 (2023.01)

(52) U.S. Cl.
CPC ............ *H01L 28/92* (2013.01); *H01L 29/945* (2013.01); *H10B 12/038* (2023.02); *H10B 12/373* (2023.02)

(58) Field of Classification Search
None
See application file for complete search history.

(56) References Cited

U.S. PATENT DOCUMENTS

| 5,508,542 | A | | 4/1996 | Geiss et al. |
| 5,635,419 | A | * | 6/1997 | Geiss ................ H01L 29/66181 |
| | | | | 438/386 |
| 5,739,565 | A | | 4/1998 | Nakamura et al. |
| 10,461,148 | B1 | * | 10/2019 | Reznicek et al. ... H01L 23/5223 |
| 2005/0269617 | A1 | * | 12/2005 | Hofmann .......... H01L 27/10832 |
| | | | | 257/309 |
| 2013/0102150 | A1 | * | 4/2013 | Oh ...................... H01L 45/1253 |
| | | | | 438/667 |
| 2016/0308020 | A1 | | 10/2016 | Sreenivasan et al. |

FOREIGN PATENT DOCUMENTS

| JP | 05-160342 | A | 6/1993 |
| JP | 06-013547 | A | 1/1994 |
| JP | 3079021 | B2 | 8/2000 |
| JP | 2018-513565 | A | 5/2018 |
| WO | WO 2019/171750 | A1 | 9/2019 |

* cited by examiner

*Primary Examiner* — Steven M Christopher
(74) *Attorney, Agent, or Firm* — Oblon, McClelland, Maier & Neustadt, L.L.P.

(57) ABSTRACT

According to an embodiment, a capacitor includes a conductive substrate, a conductive layer, and a dielectric layer. The conductive substrate has a first main surface and a second main surface and is provided with a plurality of recesses on the first main surface. The conductive substrate is further provided with a plurality of holes in one or more portions each sandwiched between two adjacent ones of the recesses such that a region on a side of the first main surface has a larger porosity than a region on a side of the second main surface. The conductive layer covers the first main surface, side walls and bottom surfaces of the recesses, and walls of the holes. The dielectric layer is interposed between the conductive substrate and the conductive layer.

21 Claims, 6 Drawing Sheets

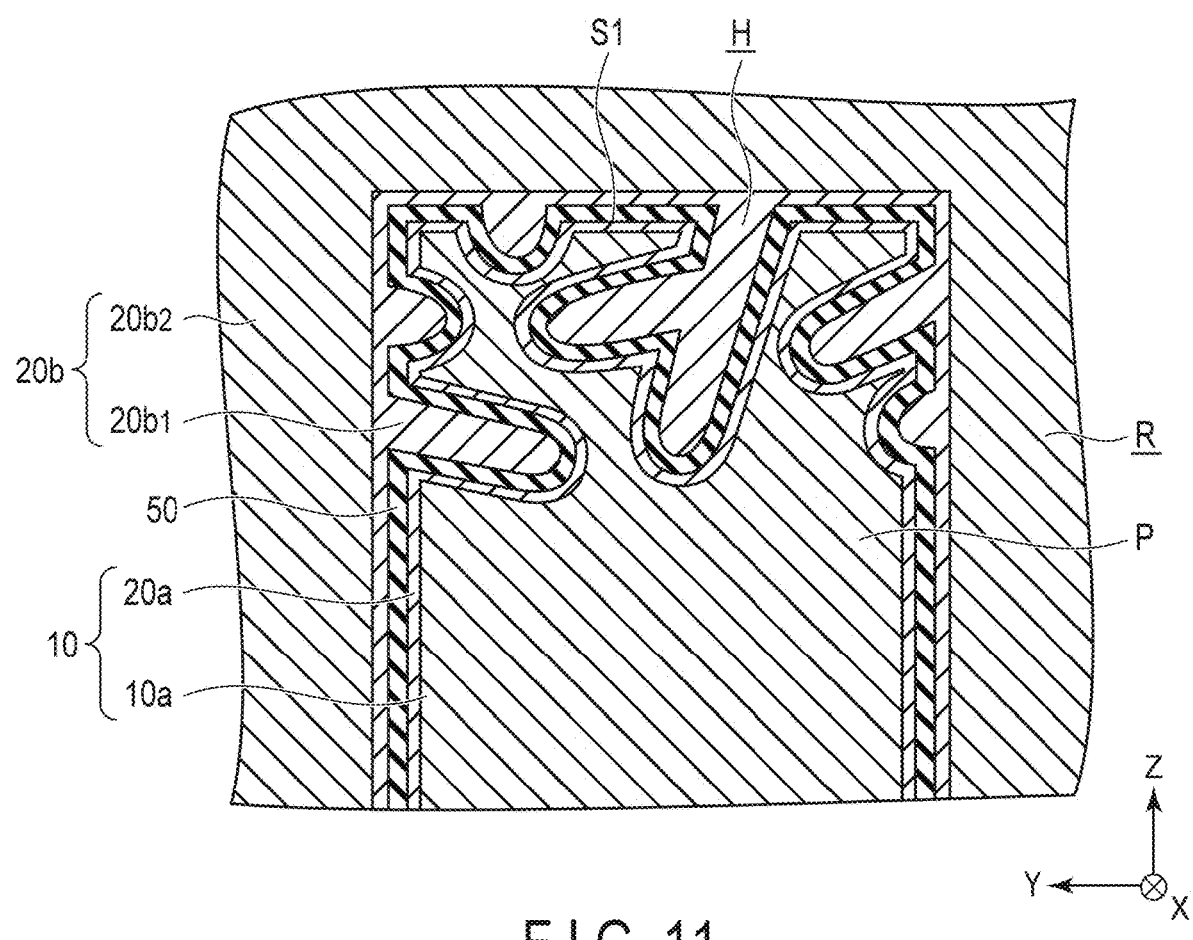
F I G. 11

CAPACITOR

CROSS-REFERENCE TO RELATED APPLICATIONS

This application is based upon and claims the benefit of priority from Japanese Patent Application No. 2019-007776, filed Jan. 21, 2019, the entire contents of which are incorporated herein by reference.

FIELD

Embodiments described herein relate generally to a capacitor.

BACKGROUND

Many electrical and electronic devices include capacitors. Such capacitors can be obtained by, for example, forming conductive layers and a dielectric layer on a silicon substrate.

BRIEF DESCRIPTION OF THE DRAWINGS

FIG. 11 is a cross-sectional view showing a part of a capacitor according to a second embodiment in an enlarged manner.

DETAILED DESCRIPTION

Figure 1:
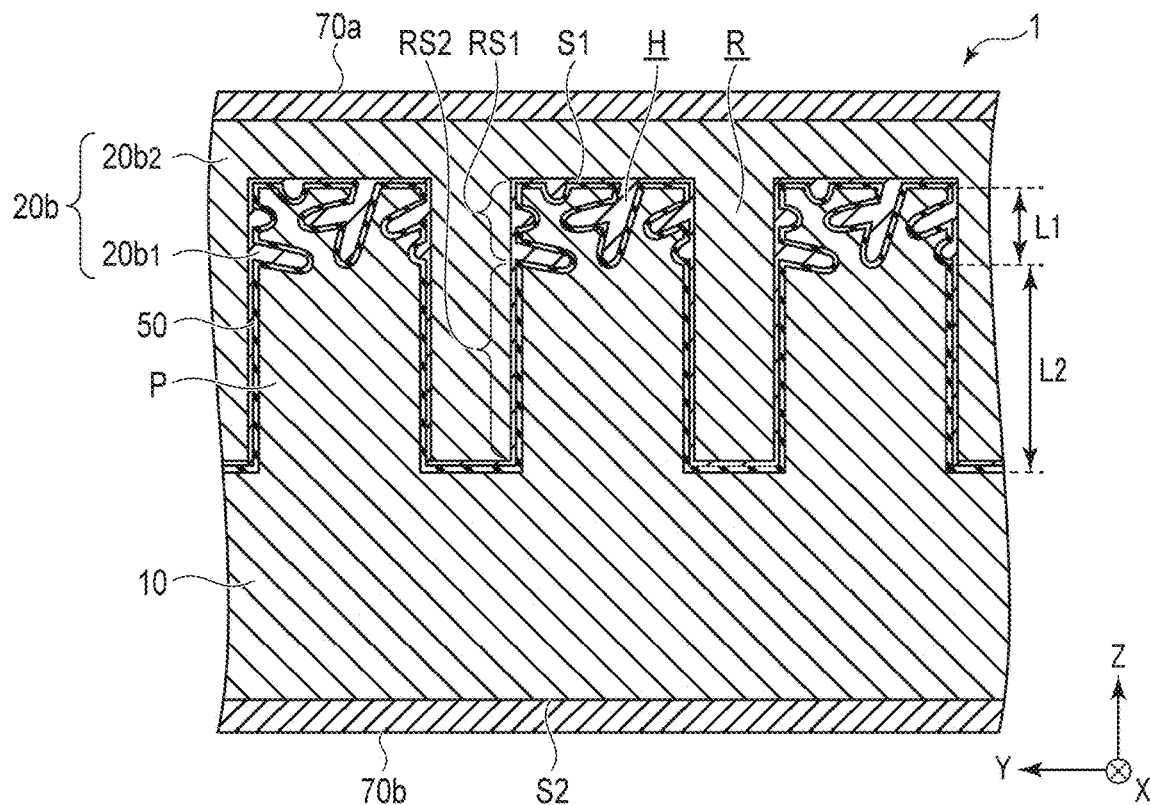
FIG. 1 is a cross-sectional view schematically showing a capacitor according to a first embodiment.

According to an aspect, there is provided a capacitor comprising: a conductive substrate having a first main surface and a second main surface and provided with a plurality of recesses on the first main surface, the conductive substrate further provided with a plurality of holes in one or more portions each sandwiched between two adjacent ones of the plurality of recesses such that a region on a side of the first main surface has a larger porosity than a region on a side of the second main surface; a conductive layer covering the first main surface, side walls and bottom surfaces of the plurality of recesses, and walls of the plurality of holes; and a dielectric layer interposed between the conductive substrate and the conductive layer.

Embodiments will be explained in detail below with reference to the accompanying drawings. Note that the same reference numerals denote constituent elements which achieve the same or similar functions throughout all the drawings, and a repetitive explanation will be omitted.

First Embodiment

Figure 2:
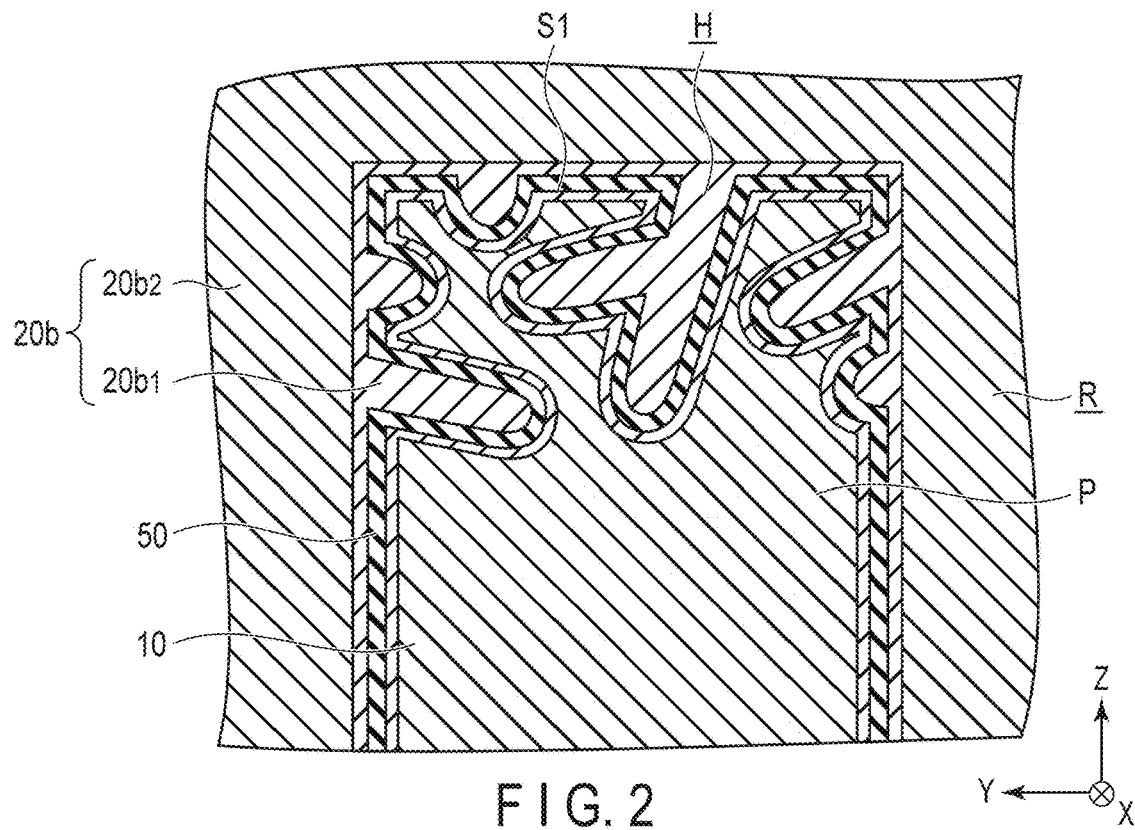
FIG. 2 is a cross-sectional view showing a part of the capacitor shown in FIG. 1 in an enlarged manner.

FIG. 1 is a cross-sectional view schematically showing a capacitor according to a first embodiment. FIG. 2 is a cross-sectional view showing a part of the capacitor shown in FIG. 1 in an enlarged manner.

A capacitor 1 shown in FIG. 1 includes a conductive substrate 10, a conductive layer 20*b*, and a dielectric layer 50.

Incidentally, in each figure, an X direction is a direction parallel to a main surface of the conductive substrate 10, and a Y direction is a direction parallel to the main surface of the conductive substrate 10 and perpendicular to the X direction. In addition, a Z direction is a thickness direction of the conductive substrate 10, i.e., a direction perpendicular to the X direction and the Y direction.

The conductive substrate 10 has electrical conductivity in its entire part. The conductive substrate 10 is, for example, a semiconductor substrate made of a semiconductor doped with P-type or N-type impurities, or a metal substrate. The conductive substrate 10 is preferably a substrate containing silicon such as a silicon substrate. Such a substrate can be processed using semiconductor processes.

The conductive substrate 10 has a first main surface S1, and a second main surface S2 which is a back surface of the first main surface S1.

As shown in FIGS. 1 and 2, the first main surface S1 is provided with a plurality of recesses R. Here, these recesses R are trenches each having a shape extending in the X direction as a first direction. As shown in FIG. 1, the recesses R are arranged in the Y direction as a second direction.

A depth D of the recesses R is preferably within a range of 1% to 90%, and more preferably within a range of 1% to 50% of a thickness T of the conductive substrate 10. When this ratio is increased, a capacitance of the capacitor 1 becomes larger. However, when this ratio is increased, the mechanical strength of the capacitor 1 decreases.

A dimension of openings of the recesses R is preferably 0.3 μm or more. Incidentally, the dimension of the opening of the recess R is a diameter or width of the opening of the recess R. Here, the dimension of the opening of the recess R is a dimension in a direction perpendicular to its length direction, i.e., a dimension in a direction perpendicular to a length direction of an orthogonal projection of the recess R onto a plane perpendicular to the thickness direction of the conductive substrate 10. When this dimension is reduced, a larger electric capacitance can be achieved. However, when this dimension is reduced, it is difficult to form a stacked structure including the dielectric layer 50, and a first layer 20*b*1 to be described later, in the recess R.

A distance between adjacent recesses R is preferably 0.1 μm or more. When this distance is reduced, a larger electric capacitance can be achieved. However, when this distance is reduced, portions P of the conductive substrate 10 each sandwiched between two adjacent ones of the recesses R are likely to be damaged.

The recesses R can have various shapes. For example, the recess R may have a shape whose orthogonal projection onto a plane perpendicular to the Z direction is linear, curved or bent, or circular or square.

Here, a cross section of the recess R parallel to the depth direction is rectangular. This cross section may not be rectangular. For example, this cross section may have a tapered shape.

One or more portions P of the conductive substrate 10 each sandwiched between two adjacent ones of the recesses R are provided with a plurality of holes H. These holes H are not uniformly provided in the portions P. In the portion P, the holes H are provided such that a region on its first main surface S1 side has a larger porosity in than a region on its second main surface S2 side.

Here, each of the portions P is provided with the holes H only in the region on the first main surface S1 side. That is, here, each of the portions P includes a first region RS1 that is porous, and a second region RS2 that is non-porous and interposed between the first region RS1 and the second main surface S2.

If the holes H are provided only in the region on the first main surface S1 side of the portion P, a ratio of a dimension L1 of the first region RS1 in the depth direction of the recess R to a dimension L2 of the second region RS2 in the depth direction of the recess R is arbitrary. That is, a ratio of the dimension L1 to the depth D of the recess R, and a ratio of the dimension L2 to the depth D of the recess R, are arbitrary. However, when the ratio L1/D of the dimension L1 to the depth D is increased, the portion P is likely to be damaged in a manufacturing process of the capacitor 1, and a parasitic resistance of the capacitor 1 increases, although the capacitance of the capacitor 1 can be easily increased.

The ratio L1/D is preferably within a range of 1% to 50%, and more preferably within a range of 3% to 10%. The dimension L1 is preferably within a range of 1 μm to 50 μm, and more preferably within a range of 3 μm to 10 μm.

As long as the region on the first main surface S1 side has a larger porosity than the region on the second main surface S2 side, the holes H may be provided not only in the region on the first main surface S1 side but also in the region on the second main surface S2 side. In this case, the porosity of the portion P may change in a continuous or stepwise manner in the depth direction of the recess R. In each portion P, the minimum value of the porosity is preferably 1% or less, and more preferably 0%. In addition, in each portion P, the maximum value of the porosity is preferably within a range of 10% to 90%, and more preferably within a range of 30% to 70%.

Note that "the porosity" mentioned here is a value obtained by the following method. First, a cross section of the portion P parallel to the depth direction of the recess R is photographed using a scanning electron microscope at a magnification of ×20,000 to ×100,000. Then, a proportion of the area of the holes H in the area of the portion P is obtained in this image. The value obtained in this way is the porosity.

Each of the holes H may be a blind hole or a through hole. Each of the holes H may be branched or may not be branched. Each of the holes H may be connected to other holes H or may not be connected.

An average diameter of the holes H is preferably 0.05 μm or more. When the diameter of the holes H is reduced, more holes H can be disposed, thereby achieving a larger electric capacitance. However, when the diameter of the holes H is reduced too much, there is a possibility that it may be difficult to form, in the holes H, a stacked structure including the dielectric layer 50 and the first layer 20b1 to be described later.

The conductive layer 20b covers the first main surface S1, side walls and bottom surfaces of the recesses R, and walls of the holes H. The conductive layer 20b may have a single-layer structure, or may have a multi-layer structure. Here, the conductive layer 20b has a double-layer structure of the first layer 20b1 and a second layer 20b2.

The first layer 20b1 is a layer having electrical conductivity. The first layer 20b1 covers the first main surface S1, the side walls and the bottom surfaces of the recesses R, and the walls of the holes H.

Here, portions of the first layer 20b1 that face the first main surface S1 and the side walls and the bottom surfaces of the recesses R are conformal to a surface of the conductive substrate 10. That is, here, the first layer 20b1 is a layer having an approximately uniform thickness. Portions of the first layer 20b1 that face the first main surface S1 and the side walls and the bottom surfaces of the recesses R may not be conformal to the surface of the conductive substrate 10.

The first layer 20b1 and the dielectric layer 50 fill the holes H. That is, the holes H are filled with the dielectric layer 50 and the first layer 20b1, without leaving a gap. With this structure, a possibility that the portion P may be damaged during a period from forming the first layer 20b1 until forming the second layer 20b2 can be reduced. Portions of the first layer 20b1 positioned in the holes H may be conformal to the walls of the holes H.

The second layer 20b2 is a layer having electrical conductivity. The second layer 20b2 faces the first main surface S1, the side walls and the bottom surfaces of the recesses R, and the walls of the holes H, with the first layer 20b1 interposed therebetween.

The second layer 20b2, the dielectric layer 50, and the first layer 20b1 fill the recesses R. Portions of the second layer 20b2 that face the side walls and the bottom surfaces of the recesses R may be conformal to the side walls and the bottom surfaces of the recesses R.

The conductive layer 20b and the dielectric layer 50 fill the holes H. That is, the holes H are filled with the dielectric layer 50 and the conductive layer 20b, without leaving a gap. With this structure, a possibility that the portion P may be damaged after forming the conductive layer 20b can be reduced. Portions of the conductive layer 20b positioned in the holes H may be conformal to the walls of the holes H.

The conductive layer 20b and the dielectric layer 50 fill the recesses R. Portions of the conductive layer 20b that face the side walls and the bottom surfaces of the recesses R may be conformal to the side walls and the bottom surfaces of the recesses R.

Each layer constituting the conductive layer 20b is made of, for example, polysilicon doped with impurities to improve electrical conductivity. Each layer constituting the conductive layer 20b may be a layer made of a metal or alloy such as nickel, copper, or tungsten.

The material of the first layer 20b1 and the material of the second layer 20b2 may be the same or different. Here, it is supposed that the first layer 20b1 and the second layer 20b2 are made of polysilicon doped with P-type or N-type impurities.

The thickness of the first layer 20b1 is preferably within a range of 0.05 μm to 1 μm, and more preferably within a range of 0.1 μm to 0.3 μm. If the first layer 20b1 is thin, there is a possibility that a discontinuous portion may be generated in the first layer 20b1, or a sheet resistance of the first layer 20b1 may be excessively increased. If the first layer 20b1 is thick, it may be difficult to form the dielectric layer 50 with a sufficient thickness.

The dielectric layer 50 is interposed between the conductive substrate 10 and the conductive layer 20b. The dielectric layer 50 is conformal to the surface of the conductive substrate 10, specifically, to the first main surface S1, the side walls and the bottom surfaces of the recesses R, and the inner walls of the holes H. The dielectric layer 50 electrically insulates the conductive substrate 10 and the conductive layer 20b from each other. The dielectric layer 50 may have a single-layer structure or a multi-layer structure.

The dielectric layer 50 is made of, for example, an inorganic dielectric. As the inorganic dielectric, a ferroelectric, e.g., HfSiO, HfSiON, or $HfO_2$, can also be used. For example, paraelectrics such as silicon nitride, silicon oxide, silicon oxynitride, titanium oxide, alumina, and tantalum oxide are preferable. These paraelectrics have a small change in dielectric constant with temperature. Therefore, when the paraelectrics are used for the dielectric layer 50, the heat resistance of the capacitor 1 can be improved.

The dielectric layer 50 preferably includes a silicon oxide layer. The dielectric layer 50 including a silicon oxide layer is, for example, a silicon oxide layer, or a layer having a multi-layer structure including one or more silicon oxide layers and one or more other layers. This layer having a multi-layer structure is, for example, a layer including a silicon oxide layer and a silicon nitride layer, a layer including a silicon oxide layer and a silicon oxynitride layer, or a layer including a silicon oxide layer and a metal oxide layer. Incidentally, if a silicon substrate is used as the conductive substrate 10, a silicon oxide layer, a silicon nitride layer, and a silicon oxynitride layer can be formed respectively by oxidizing, nitriding, or oxynitriding a surface region of the conductive substrate 10.

The thickness of the dielectric layer 50 is preferably within a range of 0.005 μm to 0.5 μm, and more preferably within a range of 0.01 μm to 0.1 μm. If the dielectric layer 50 is thin, there is a possibility that a discontinuous portion may be generated in the dielectric layer 50, and the conductive substrate 10 and the conductive layer 20b may be short-circuited. Further, when the dielectric layer 50 is thinned, a withstand voltage is lowered even if there is no short circuit, and a possibility of short-circuiting on voltage application increases. When the dielectric layer 50 is thickened, the withstand voltage increases, but the electric capacitance decreases.

This capacitor 1 further includes a first electrode 70a and a second electrode 70b.

The first electrode 70a faces the first main surface S1, and is electrically connected to the conductive layer 20b. Here, the first electrode 70a is provided on the conductive layer 20b, and the second electrode 70b is provided on the second main surface S2.

As long as the first electrode 70a and the second electrode 70b are electrically insulated from the conductive substrate 10 and the conductive layer 20b, respectively and electrically connected to the conductive layer 20b and the conductive substrate 10, respectively, both of them may be provided on one main surface of the capacitor 1.

The first electrode 70a and the second electrode 70b may have a single-layer structure or a multi-layer structure. Each layer constituting the first electrode 70a and the second electrode 70b is made of a metal or alloy such as aluminum, copper, nickel, or a nickel alloy.

This capacitor 1 is manufactured, for example, by the following method.

Figure 3:
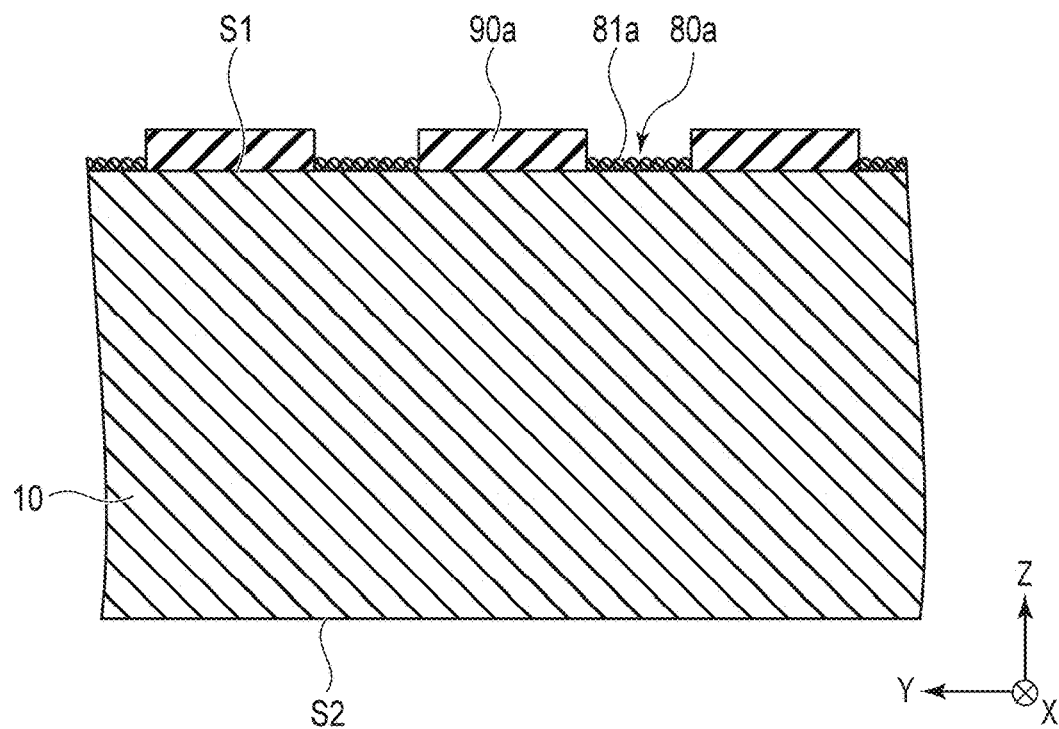
FIG. 3 is a cross-sectional view schematically showing a process in the manufacture of the capacitor shown in FIG. 1.
Figure 4:
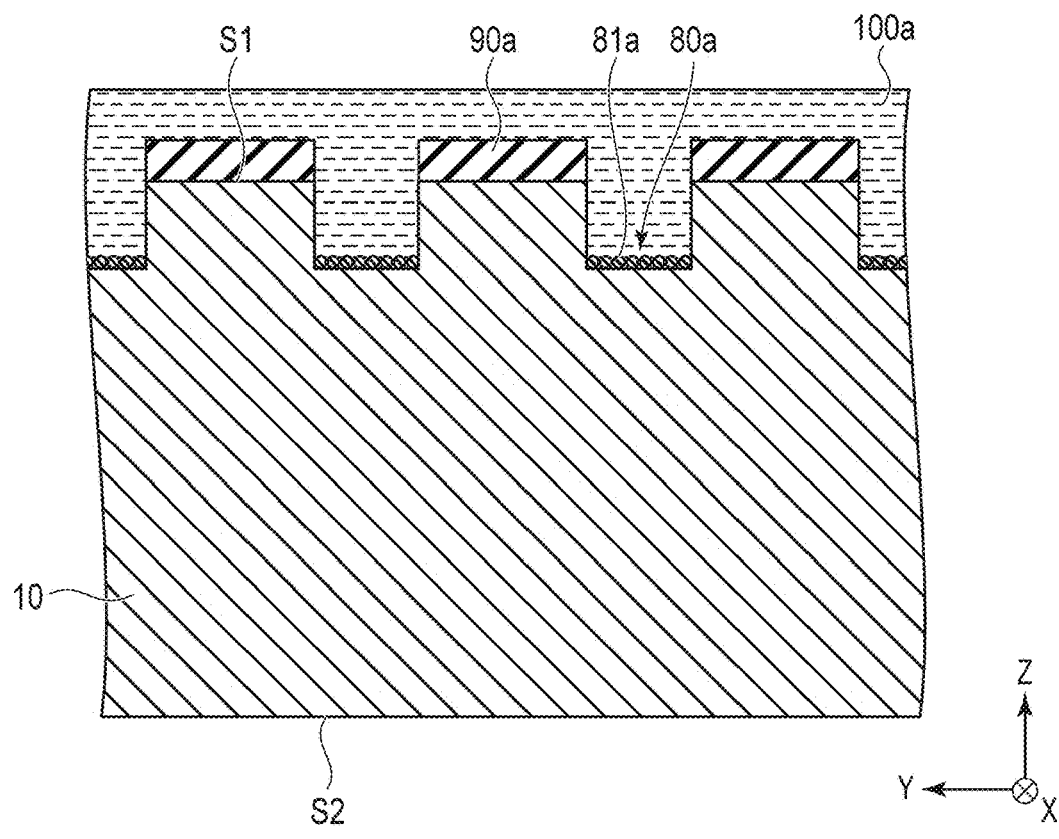
FIG. 4 is a cross-sectional view schematically showing another process in the manufacture of the capacitor shown in FIG. 1.
Figure 5:
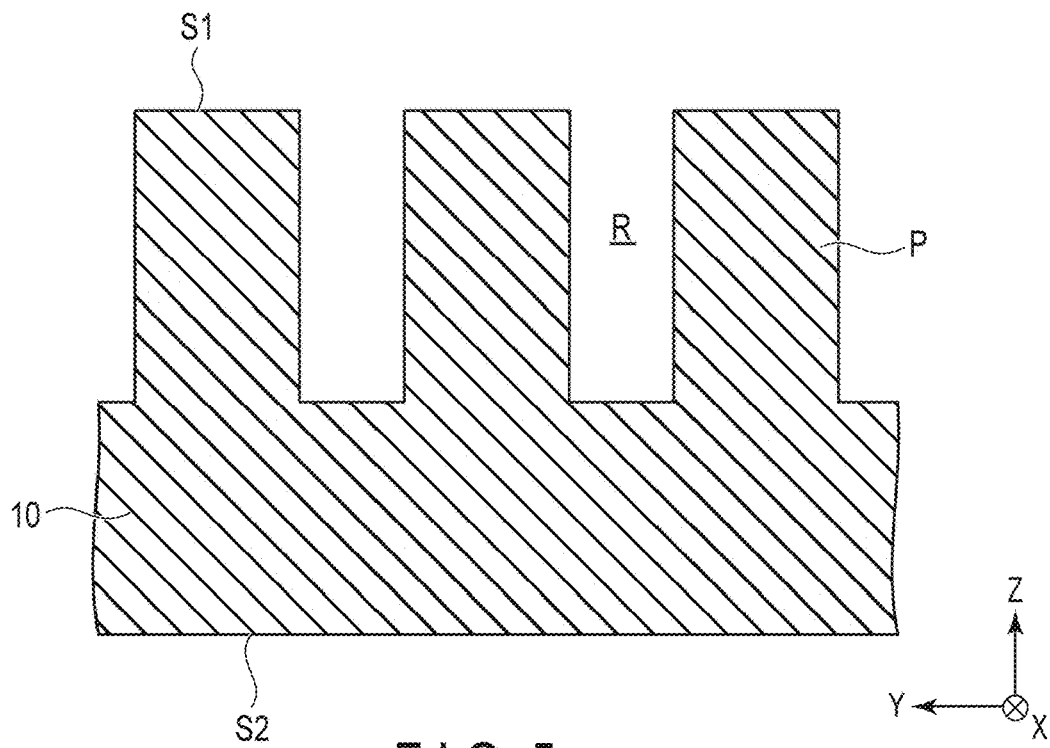
FIG. 5 is a cross-sectional view schematically showing an example of a structure obtained by the process of FIG. 4.
Figure 6:
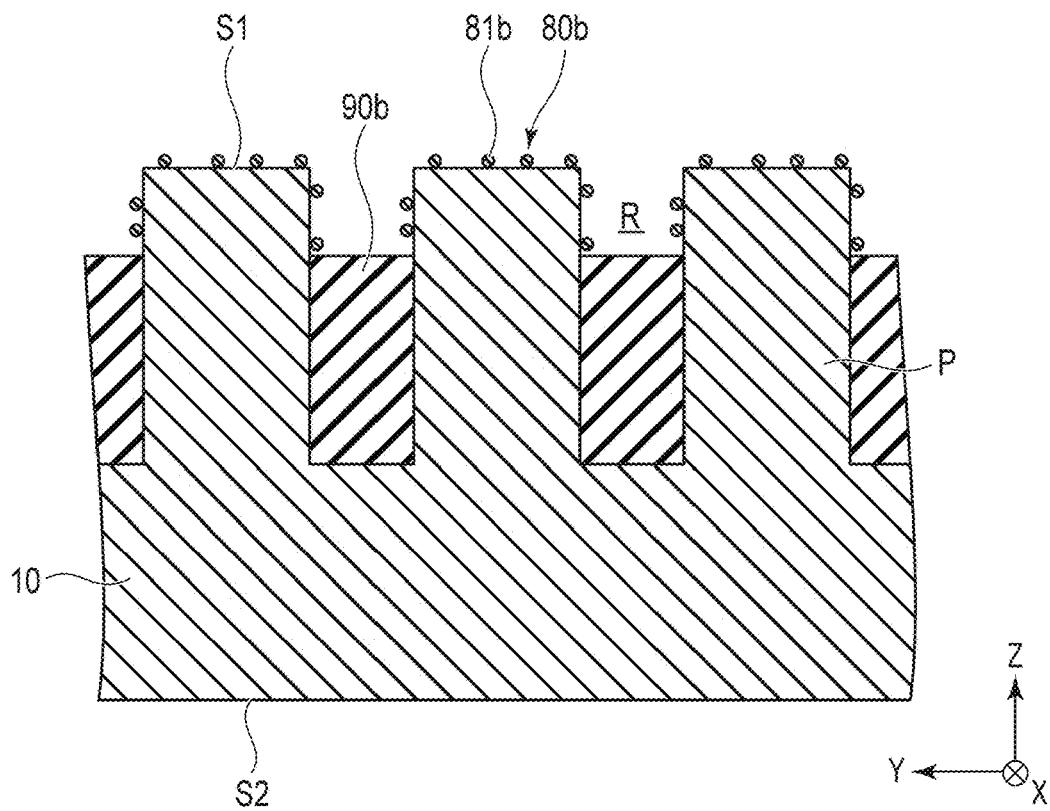
FIG. 6 is a cross-sectional view schematically showing still another process in the manufacture of the capacitor shown in FIG. 1.
Figure 7:
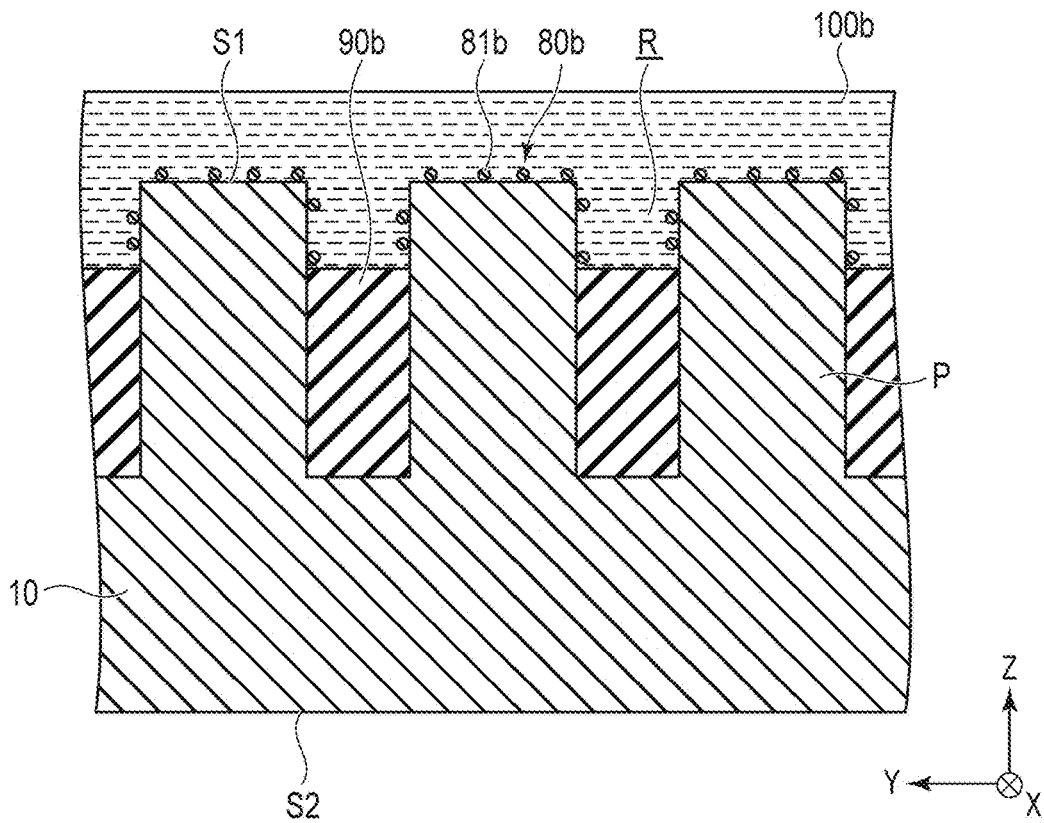
FIG. 7 is a cross-sectional view schematically showing still another process in the manufacture of the capacitor shown in FIG. 1.
Figure 8:
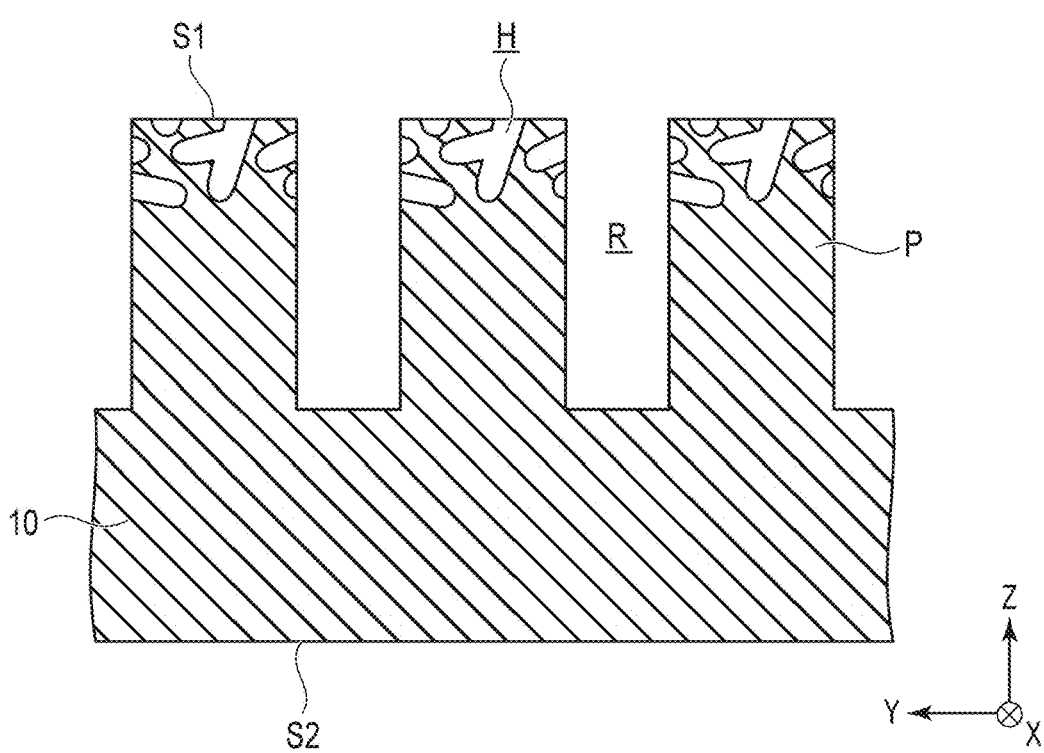
FIG. 8 is a cross-sectional view schematically showing an example of a structure obtained by the process of FIG. 7.
Figure 9:
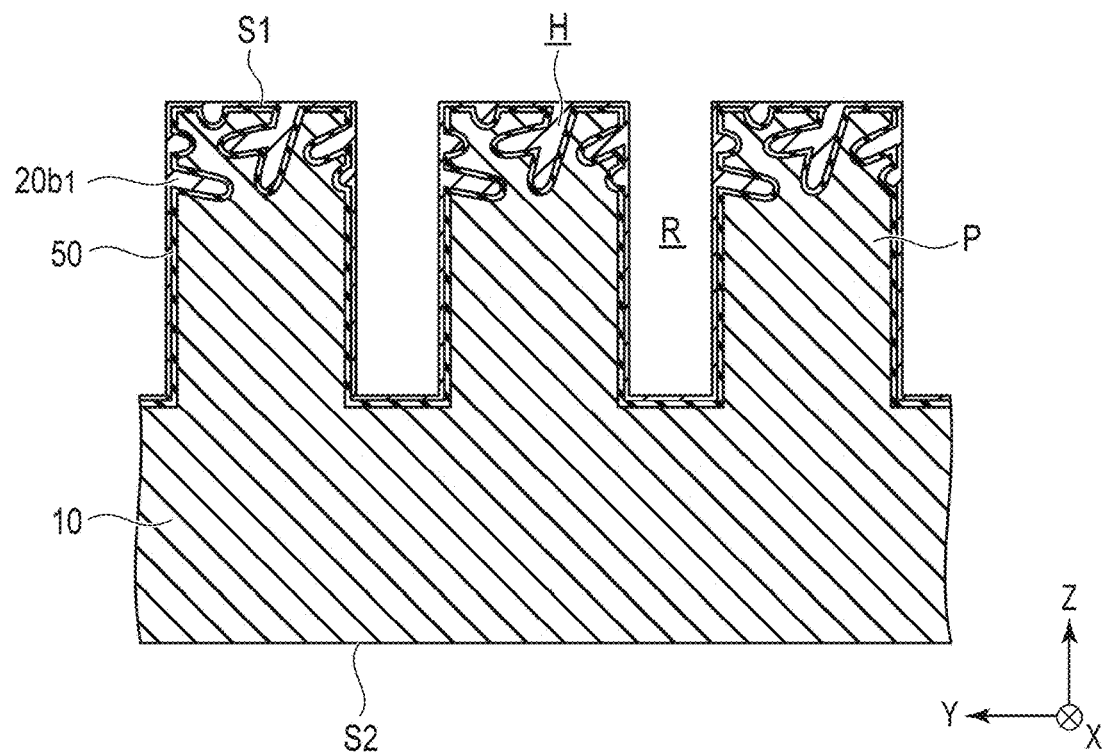
FIG. 9 is a cross-sectional view schematically showing still another process in the manufacture of the capacitor shown in FIG. 1.

FIG. 3 is a cross-sectional view schematically showing a process in the manufacture of the capacitor shown in FIG. 1. FIG. 4 is a cross-sectional view schematically showing another process in the manufacture of the capacitor shown in FIG. 1. FIG. 5 is a cross-sectional view schematically showing an example of a structure obtained by the process of FIG. 4. FIG. 6 is a cross-sectional view schematically showing still another process in the manufacture of the capacitor shown in FIG. 1. FIG. 7 is a cross-sectional view schematically showing still another process in the manufacture of the capacitor shown in FIG. 1. FIG. 8 is a cross-sectional view schematically showing an example of a structure obtained by the process of FIG. 7. FIG. 9 is a cross-sectional view schematically showing still another process in the manufacture of the capacitor shown in FIG. 1.

In this method, the conductive substrate 10 shown in FIG. 3 is first prepared. Here, as an example, it is supposed that the conductive substrate 10 is a single-crystal silicon wafer doped with P-type or N-type impurities. A plane orientation of the single-crystal silicon wafer is not particularly limited, but in this example, a silicon wafer whose first main surface S1 is a (100) plane is used. As the conductive substrate 10, a silicon wafer whose first main surface S1 is a (110) plane can also be used.

Next, the recesses R are formed on the conductive substrate 10 by MacEtch (Metal-Assisted Chemical Etching).

That is, as shown in FIG. 3, a first catalyst layer 80a containing a first noble metal is first formed on the first main surface S1 of the conductive substrate 10. The first catalyst layer 80a is formed so as to partially cover the first main surface S1.

Specifically, a first mask layer 90a is first formed on the first main surface S1 of the conductive substrate 10.

The first mask layer 90a is opened at positions corresponding to the recesses R. The first mask layer 90a prevents the first noble metal to be described later from coming into contact with a portion of the first main surface S1 that is covered with the first mask layer 90a.

Examples of the material of the first mask layer 90a include organic materials such as polyimide, fluororesin, phenol resin, acrylic resin, and novolac resin, and inorganic materials such as silicon oxide and silicon nitride.

The first mask layer 90a can be formed by, for example, existing semiconductor processes. The first mask layer 90a made of an organic material can be formed by, for example, photolithography. The first mask layer 90a made of an inorganic material can be formed by, for example, the deposition of an inorganic material layer by vapor phase deposition, formation of a mask by photolithography, and patterning of the inorganic material layer by etching. Alternatively, the first mask layer 90a made of an inorganic material can be formed by oxidation or nitriding of the surface region of the conductive substrate 10, formation of a mask by photolithography, and patterning of an oxide or nitride layer by etching.

Next, the first catalyst layer 80a is formed on regions of the first main surface S1 that are not covered with the first mask layer 90a. The first catalyst layer 80a is, for example, a discontinuous layer containing the first noble metal. Here, as an example, it is supposed that the first catalyst layer 80a is a particulate layer formed of first catalyst particles 81a containing the first noble metal.

The first noble metal is, for example, one or more of gold, silver, platinum, rhodium, palladium, and ruthenium. The first catalyst layer 80a and the first catalyst particles 81a may further contain a metal other than a noble metal, e.g. titanium.

The first catalyst layer 80a can be formed by, for example, electroplating, reduction plating, or displacement plating. The first catalyst layer 80a may also be formed by application of a dispersion containing noble metal particles, or vapor deposition such as evaporation and sputtering. Of these methods, the displacement plating is particularly favorable because it is possible to directly and evenly deposit the first noble metal on regions of the first main surface S1 that are not covered with the first mask layer 90a.

Next, the conductive substrate 10 is etched with an assist from the first noble metal as a catalyst to form the recesses R shown in FIGS. 1 and 5 on the substrate 10.

Specifically, as shown in FIG. 4, the conductive substrate 10 is etched with a first etchant 100a. For example, the conductive substrate 10 is immersed in the first etchant 100a in liquid form to bring the first etchant 100a into contact with the first main surface S1 of the conductive substrate 10.

The first etchant 100a contains an oxidizer and hydrogen fluoride.

The concentration of hydrogen fluoride in the first etchant 100a is preferably within a range of 1 mol/L to 20 mol/L, and more preferably within a range of 5 mol/L to 10 mol/L. When the hydrogen fluoride concentration is low, it is difficult to achieve a high etching rate. When the hydrogen fluoride concentration is high, excess side etching may occur.

The oxidizer can be selected from, for example, hydrogen peroxide, nitric acid, $AgNO_3$, $KAuCl_4$, $HAuCl_4$, $K_2PtCl_6$, $H_2PtCl_6$, $Fe(NO_3)_3$, $Ni(NO_3)_2$, $Mg(NO_3)_2$, $Na_2S_2O_8$, $K_2S_2O_8$, $KMnO_4$, and $K_2Cr_2O_7$. Hydrogen peroxide is preferable as the oxidizer, since no harmful byproduct is produced and no contamination of the semiconductor element occurs.

The concentration of the oxidizer in the first etchant 100a is preferably within a range of 0.2 mol/L to 8 mol/L, and more preferably within a range of 2 mol/L to 4 mol/L.

The first etchant 100a may further contain a buffering agent. The buffering agent contains, for example, at least one of ammonium fluoride and ammonia. As an example, the buffering agent is ammonium fluoride. As another example, the buffering agent is a mixture of ammonium fluoride and ammonia.

The first etchant 100a may further contain other components such as water.

When such a first etchant 100a is used, the material of the conductive substrate 10, i.e. silicon in this example, is oxidized only in regions of the conductive substrate 10 that are close to the first catalyst particles 81a. Oxide generated thereby is dissolved and removed by hydrofluoric acid. Therefore, only the portions close to the first catalyst particles 81a are selectively etched.

The first catalyst particles 81a move toward the second main surface S2 with the progress of etching, where etching similar to the above is performed. As a result, as shown in FIG. 4, at the position of the first catalyst layer 80a, etching proceeds from the first main surface S1 toward the second main surface S2 in a direction perpendicular to the first main surface S1. In this way, as shown in FIG. 5, the recesses R are formed on the first main surface S1.

Thereafter, the first mask layer 90a and the first catalyst layer 80a are removed from the conductive substrate 10. At least one of the first mask layer 90a and the first catalyst layer 80a may not be removed from the conductive substrate 10.

Next, as shown in FIG. 6, a second mask layer 90b is formed on the conductive substrate 10. The second mask layer 90b is formed such that top surfaces of the portions P and regions of the side surfaces of the portions P adjacent to the openings of the recesses R are exposed, and a region of each recess R that is on its bottom portion side is filled. The second mask layer 90b prevents the noble metal to be described later from contacting the bottom surfaces of the recesses R and the regions of the side walls of the recesses R adjacent to the bottom surfaces.

As a material of the second mask layer 90b, for example, those exemplified for the first mask layer 90a can be used. The second mask layer 90b can be formed, for example, by the method exemplified for the first mask layer 90a.

Next, the second catalyst layer 80b is formed on the top surfaces of the portions P and the regions of the side surfaces of the portions P that are adjacent to the openings of the recesses R. The second catalyst layer 80b is a discontinuous layer containing a second noble metal. Specifically, the second catalyst layer 80b is a particulate layer formed of second catalyst particles 81b containing the second noble metal.

As the second noble metal, for example, those exemplified for the first noble metal can be used. The second catalyst layer 80b and the second catalyst particles 81b may further contain a metal other than a noble metal, e.g. titanium.

The second catalyst layer 80b can be formed, for example, by the method exemplified for the first catalyst layer 80a. Note that the second catalyst layer 80b is formed, for example, so as to generate larger gaps between the second catalyst particles 81b than the gaps between the first catalyst particles 81a.

Next, the conductive substrate 10 is etched with an assist from the second noble metal as a catalyst to form the holes H shown in FIGS. 1, 2, and 8 on the conductive substrate 10.

Specifically, as shown in FIG. 7, the conductive substrate 10 is etched with a second etchant 100b. For example, the conductive substrate 10 is immersed in the liquid second etchant 100b to bring the second etchant 100b into contact with the top surfaces of the portions P and the regions of the side surfaces of the portions P that are adjacent to the openings of the recesses R. As the second etchant 100b, for example, those exemplified for the first etchant 100a can be used. In this way, as shown in FIG. 8, the holes H are formed in the portions P.

Thereafter, the second mask layer 90b and the second catalyst particles 81b are removed from the conductive substrate 10. The second catalyst particles 81b may not be removed from the conductive substrate 10.

Next, the dielectric layer 50 and the first layer 20b1 shown in FIG. 9 are formed in this order on the conductive substrate 10.

The dielectric layer 50 can be formed by, for example, CVD (chemical vapor deposition). Alternatively, the dielectric layer 50 can be formed by oxidizing, nitriding, or oxynitriding the surface of the conductive substrate 10.

If the first layer 20b1 is made of polysilicon doped with P-type or N-type impurities, such a first layer 20b1 can be formed by, for example, LPCVD (low pressure chemical vapor deposition).

Subsequently, the second layer 20b2 and the first electrode 70a shown in FIG. 1 are formed in this order, and the second electrode 70b is further formed.

If the second layer 20b2 is made of polysilicon doped with P-type or N-type impurities, such a second layer 20b2 can be formed by, for example, LPCVD.

The first electrode 70a and the second electrode 70b can be formed by, for example, sputtering or plating.

In the manner described above, the capacitor 1 shown in FIG. 1 is obtained.

Figure 10:
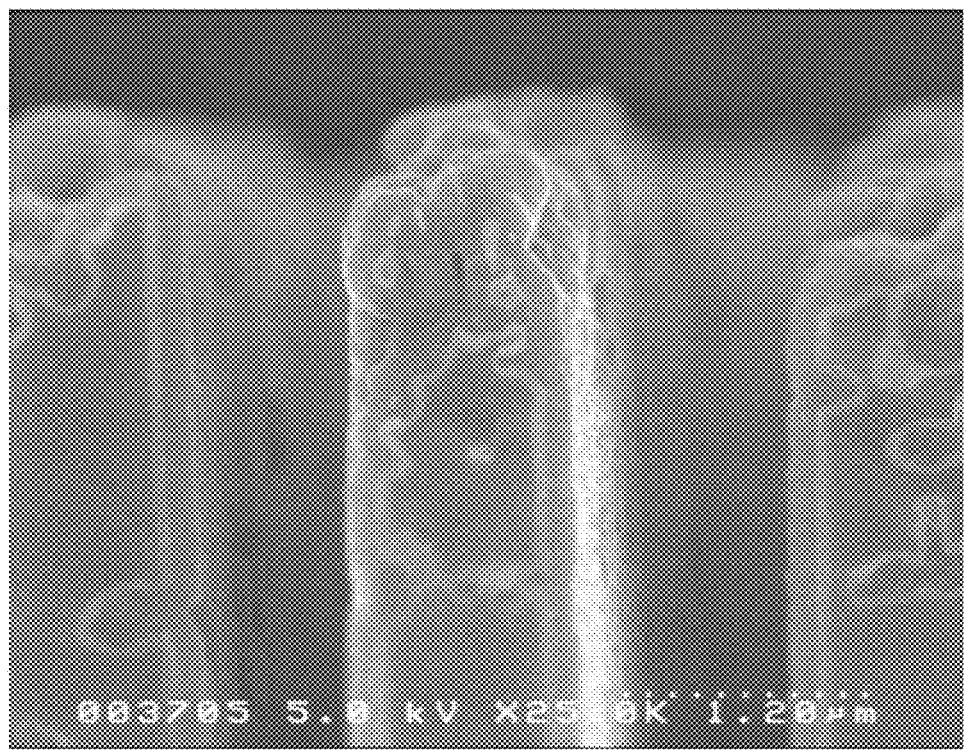
FIG. 10 is an electron micrograph showing an example of a structure obtained by the process shown in FIG. 9.

FIG. 10 is an electron micrograph showing an example of a structure obtained by the process shown in FIG. 9. The photograph shown in FIG. 10 is obtained by photographing a cross section of the portion P shown in FIG. 9 that is perpendicular to the X direction. From FIG. 10, it can be seen that the holes H are provided in the portions P, and each of these holes H is filled with a stacked structure of the dielectric layer 50 and the first layer 20b1.

In the above-described manufacturing method, if at least one of the first layer 20b1 and the second layer 20b2 is a metal layer, such a metal layer can be formed by, for example, electroplating, reduction plating, or displacement plating.

A plating solution is a liquid containing a salt of a metal to be plated. As the plating solution, a general plating solution, such as a copper sulfate plating solution containing copper sulfate pentahydrate and sulfuric acid, a copper pyrophosphate plating solution containing copper pyrophosphate and potassium pyrophosphate, and a nickel sulfamate plating solution containing nickel sulfamate and boron, can be used.

This metal layer is preferably formed by a plating method using a plating solution containing a salt of a metal to be plated, a surfactant, and carbon dioxide in a supercritical or subcritical state. In this plating method, the surfactant is interposed between particles made of supercritical carbon dioxide and a continuous phase of a solution containing a salt of a metal to be plated. That is, micelles are formed on the surfactant in the plating solution, and supercritical carbon dioxide is incorporated into these micelles.

In a normal plating method, the supply of a metal to be plated may be insufficient in the vicinity of the bottom portions of the recesses R and in the holes H. This is particularly noticeable when a ratio D/W of the depth D to a width or diameter W of the recess R, or a ratio L/d of a length L to a diameter d of the hole H is large.

The micelles incorporating supercritical carbon dioxide can easily enter narrow gaps. As the micelles move, the solution containing a salt of a metal to be plated also moves. Therefore, according to a plating method using a plating solution containing a salt of a metal to be plated, a surfactant, and carbon dioxide in a supercritical or subcritical state, a metal layer having a uniform thickness can be easily formed.

In addition, in the above manufacturing method, the recesses R and the holes H are formed by performing etching twice. Thereby, non-porous regions and porous regions are generated in the portions P.

In this method, if the second etching is repeated while changing the condition, it is possible to generate, in the portions P, non-porous regions, and two or more porous regions having mutually different porosities and arranged such that the porosity increases as the distance from the non-porous regions increases. For example, if the cycle including the processes described with reference to FIGS. 6 and 7 is repeated so that the thickness of the second mask layer 90b successively decreases for every cycle, it is possible to generate non-porous regions, and two or more porous regions having mutually different porosities and arranged such that the porosity increases as the distance from the non-porous regions increases.

Alternatively, in this method, if a plating solution having a high viscosity is used without forming the second mask layer 90b when forming the second catalyst layer 80b, the second catalyst layer 80b in which the number of the second catalyst particles 81b per unit area on the side walls of the recesses R consecutively decreases from the openings toward the bottom portions of the recesses R can be obtained. By performing the MacEtch using such a second catalyst layer 80b, a structure in which the porosity of the portions P continuously decreases from the first main surface S1 side toward the second main surface S2 side can be obtained.

In addition, it is also possible to simultaneously form the recesses R and the holes H by one-time etching if the etching conditions are set appropriately.

In this capacitor 1, the stacked structure including the dielectric layer 50 and the first layer 20b1 is provided not only on the first main surface S1 but also on the side walls and the bottom surfaces of the recesses R. Therefore, this capacitor 1 can achieve a large electric capacitance.

In addition, in this capacitor 1, the portions P of the conductive substrate 10 each sandwiched between two adjacent ones of the recesses R are provided with the holes H. The stacked structure including the dielectric layer 50 and the first layer 20b1 is also provided on the walls of the holes H. Therefore, the capacitor 1 adopting this structure can achieve a larger electric capacitance than a capacitor in which the holes H are omitted.

In a capacitor having a uniform porosity in the entire portions P, electric charges are difficult to move between the second electrode 70b and the first main surface S1 side regions of the portions P, and a parasitic resistance is large. In contrast, in the above-described capacitor 1, the holes H are provided in the portions P in such a manner that the first main surface S1 side regions have a larger porosity than the second main surface S2 side regions. Therefore, this capacitor 1 can achieve a small parasitic resistance.

In a capacitor having a uniform porosity in the entire portions P, the portions P are likely to be damaged especially in its manufacturing process. In contrast, in the above-described capacitor 1, the holes H are provided in the portions P in such a manner that the first main surface S1 side regions have a larger porosity than the second main surface S2 side regions. Therefore, the portions P of this capacitor 1 are less likely to be damaged, for example, in its manufacturing process, enabling the manufacture at a high yield.

Second Embodiment

FIG. 11 is a cross-sectional view showing a part of a capacitor according to a second embodiment in an enlarged manner. The capacitor according to the second embodiment is the same as the capacitor 1 according to the first embodiment except for the following points.

That is, in the capacitor according to the second embodiment, the conductive substrate 10 includes a substrate main body 10a and a conductive layer 20a.

The substrate main body 10a includes two main surfaces. On one main surface of the substrate main body 10a, recesses corresponding to the recesses R are provided. In addition, in a portion of the substrate main body 10a that is sandwiched between two adjacent ones of the recesses R, holes corresponding to the holes H are provided.

The substrate main body 10a may or may not have electrical conductivity. Here, as an example, it is supposed that the substrate main body 10a has electrical conductivity.

The conductive layer 20a covers the main surface of the substrate main body 10a on which the recesses are provided, side walls and bottom surfaces of these recesses, and walls of the holes provided in the portions of the substrate main body 10a each sandwiched between two adjacent ones of the recesses R. The conductive layer 20a may further cover an end face and the main surface not provided with the recesses, of the substrate main body 10a.

The conductive layer 20a is conformal to a surface of the substrate main body 10a. That is, the conductive layer 20a is a layer having an approximately uniform thickness, and together with the substrate main body 10a, forms the recesses R and the holes H on the surface of the conductive substrate 10.

As a material of the conductive layer 20a, for example, those exemplified for the conductive layer 20b can be used. In addition, the conductive layer 20a may be formed by lowering a resistance of the substrate main body 10a by ion doping, etc. According to an example, the conductive layer 20a has high electrical conductivity as compared with the substrate main body 10a.

The thickness of the conductive layer 20a is preferably within the range described above for the first layer 20b1. The conductive layer 20a can be formed, for example, by the method exemplified for the conductive layer 20b.

The capacitor adopting this structure has the same effects as those of the capacitor 1 according to the first embodiment. Furthermore, the capacitor adopting this structure can achieve a smaller parasitic resistance if the substrate main body 10a has electrical conductivity and the conductive layer 20a has high electrical conductivity as compared with the substrate main body 10a.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A capacitor comprising:
    a conductive substrate having a first main surface and a second main surface and provided with a plurality of recesses on the first main surface, each of the recesses having a bottom between the first main surface and the second main surface, the conductive substrate further provided with a plurality of holes in one or more portions, wherein the one or more portions are each sandwiched between two adjacent ones of the plurality of recesses, and the conductive substrate is provided with the plurality of holes such that a top surface of each of the one or more portions has one or more of the plurality of holes and each of the one or more portions has a larger porosity in a region adjacent to an opening of the recess than in a region adjacent to a bottom of the recess;
    a conductive layer covering the top surface, side walls and bottom surfaces of the plurality of recesses, and walls of the plurality of holes; and
    a dielectric layer interposed between the conductive substrate and the conductive layer,. the dielectric layer being in direct physical contact with the top surface and entirely covering the top surface.

2. The capacitor according to claim 1, wherein each of the one or more portions is provided with the holes only in the region on the first main surface side.

3. The capacitor according to claim 2, wherein each of the plurality of recesses is a trench.

4. The capacitor according to claim 3, further comprising:
    a first electrode facing the first main surface and electrically connected to the conductive layer; and
    a second electrode provided on the second main surface.

5. The capacitor according to claim 4, wherein the conductive substrate is a silicon substrate doped with impurities.

6. The capacitor according to claim 5, wherein the dielectric layer includes a silicon oxide layer.

7. The capacitor according to claim 6, wherein the conductive layer includes a polysilicon layer doped with impurities.

8. The capacitor according to claim 7, wherein each of the plurality of holes is filled with the dielectric layer and the conductive layer.

9. The capacitor according to claim 1, wherein each of the plurality of recesses is a trench.

10. The capacitor according to claim 9, further comprising:
    a first electrode facing the first main surface and electrically connected to the conductive layer; and
    a second electrode provided on the second main surface.

11. The capacitor according to claim 10, wherein each of the plurality of holes is filled with the dielectric layer and the conductive layer.

12. The capacitor according to claim 1, further comprising:
    a first electrode facing the first main surface and electrically connected to the conductive layer; and
    a second electrode provided on the second main surface.

13. The capacitor according to claim 12, wherein each of the plurality of holes is filled with the dielectric layer and the conductive layer.

14. The capacitor according to claim 1, wherein each of the plurality of holes is filled with the dielectric layer and the conductive layer.

15. The capacitor according to claim 1, wherein the conductive substrate is a silicon substrate doped with impurities.

16. The capacitor according to claim 15, wherein the dielectric layer includes a silicon oxide layer.

17. The capacitor according to claim 16, wherein the conductive layer includes a polysilicon layer doped with impurities.

18. The capacitor according to claim 1, wherein the dielectric layer includes a silicon oxide layer.

19. The capacitor according to claim 18, wherein the conductive layer includes a polysilicon layer doped with impurities.

20. The capacitor according to claim 1, wherein the conductive layer includes a polysilicon layer doped with impurities.

21. The capacitor according to claim 1, wherein the dielectric layer covers sides of the one or more portions and continuously extends from one of the sides over the top surface to another one of the sides for each of the one or more portions.

* * * * *